(12) United States Patent
Seo

(10) Patent No.: US 7,755,955 B2
(45) Date of Patent: Jul. 13, 2010

(54) APPARATUS AND METHOD FOR CONTROLLING DATA STROBE SIGNAL

(75) Inventor: Yoon-bum Seo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 255 days.

(21) Appl. No.: 12/051,105

(22) Filed: Mar. 19, 2008

(65) Prior Publication Data

US 2009/0067268 A1    Mar. 12, 2009

(30) Foreign Application Priority Data

Sep. 11, 2007  (KR) .................... 10-2007-0092043

(51) Int. Cl.
  *G11C 7/00*  (2006.01)
(52) U.S. Cl. ............... 365/194; 365/193; 365/189.15; 365/233.1
(58) Field of Classification Search ............... 365/193, 365/194, 189.15, 233.1, 233.13
See application file for complete search history.

(56) References Cited

U.S. PATENT DOCUMENTS 6,512,719 B2 * 1/2003 Fujisawa et al. ....... 365/189.15
2003/0021164 A1 * 1/2003 Yoo et al. ................... 365/193

* cited by examiner

*Primary Examiner*—Anh Phung
*Assistant Examiner*—Toan Le
(74) *Attorney, Agent, or Firm*—Sughrue Mion, PLLC

(57) ABSTRACT

Provided are an apparatus and method for controlling a data strobe signal. The apparatus includes a period measurement unit measuring a period of an input clock signal or data strobe signal; a controller determining a read delay time, a setup margin delay time, and a hold margin delay time of the data strobe signal on the basis of the period; a delay circuit unit outputting signals generated by delaying the data strobe signal by the read delay time, the setup margin delay time, and the hold margin delay time; a flip-flop unit latching and outputting input data by using the signals output from the delay circuit unit; and a comparator comparing outputs from the flip-flop unit and feeding a result of the comparison back to the controller. Accordingly, it is possible to stably read data recorded in a memory.

20 Claims, 6 Drawing Sheets

--PRIOR ART--

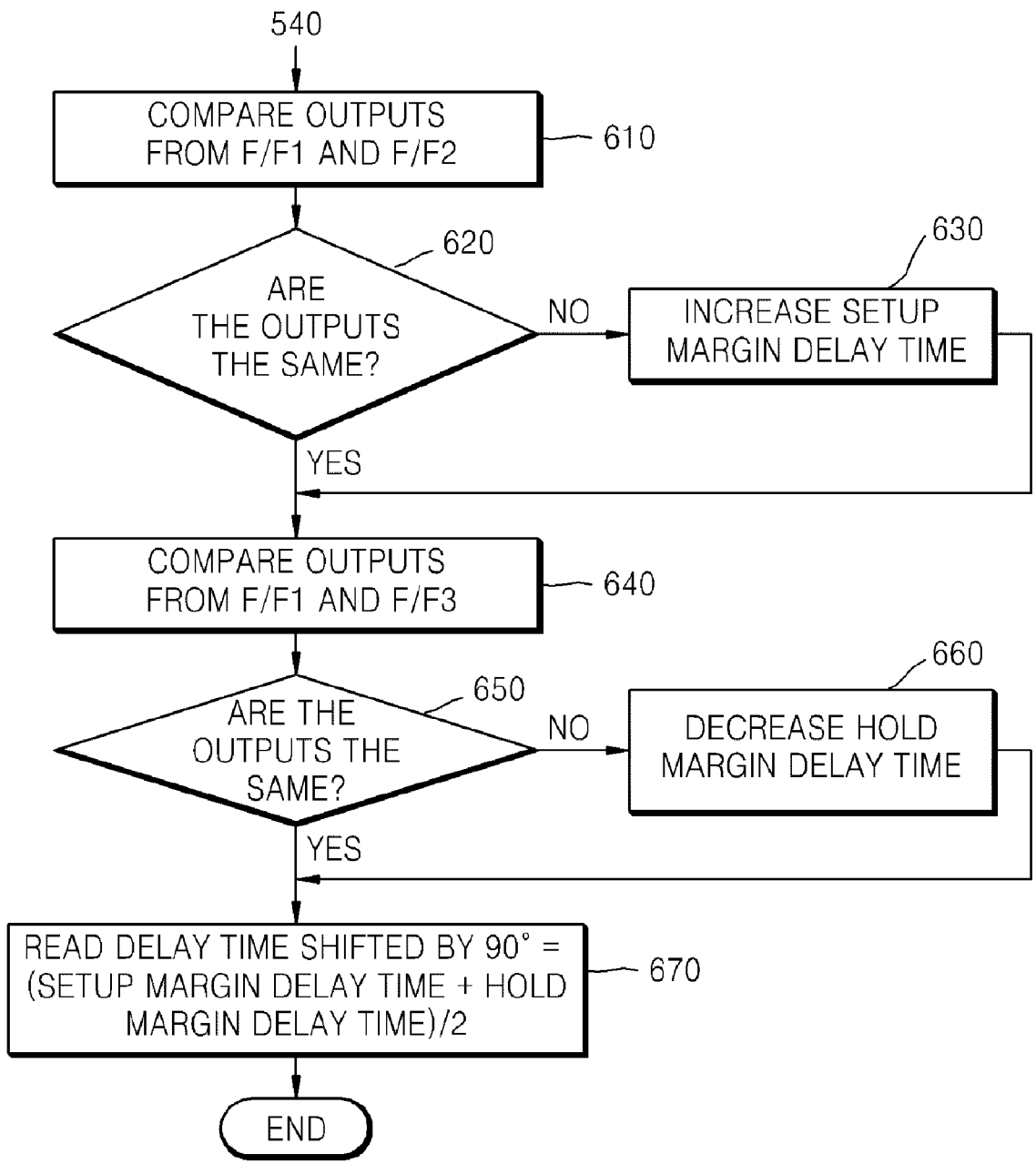

APPARATUS AND METHOD FOR CONTROLLING DATA STROBE SIGNAL

CROSS-REFERENCE TO RELATED PATENT APPLICATION

This application claims priority from Korean Patent Application No. 10-2007-0092043, filed on Sep. 11, 2007, in the Korean Intellectual Property Office, the disclosure of which is incorporated herein in its entirety by reference.

BACKGROUND OF THE INVENTION

1. Field of the Invention

The present invention relates to an apparatus for and method of controlling a data strobe signal, and more particularly, to an apparatus for and method of controlling a data strobe signal to optimize a read margin in a memory controller as much as possible.

2. Description of the Related Art

Recently, a large percentage of digital devices use a synchronous dynamic random access memory (SDRAM) that is relatively cheap as a main data storage unit. As the storage capacity of SDRAM increases and the SDRAM performs higher speed operations, timing becomes a very important factor. In addition, as the speed of an SDRAM interface increases, it is difficult for a chip including a memory controller that uses the SDRAM as the main memory to guarantee stable read operations.

FIG. 1 is a view illustrating a general apparatus for controlling a data strobe signal to read external data.

Referring to FIG. 1, the general apparatus for controlling a data strobe signal includes a delay locked loop (DLL) 110, a controller 120, a delay line 130, and a flip-flop 140.

The general apparatus for controlling a data strobe signal may be included in a memory controller. External data (DQ) and a data strobe signal (DQS) are transmitted from the SDRAM to the memory controller generally with the same phase. Therefore, the memory controller latches the transmitted external data by using the data strobe signal. Since the data strobe signal has the same phase as that of the external data, the apparatus for controlling a data strobe signal delays the data strobe signal by a predetermined time and latches the external data by using the data strobe signal. For example, in read operations of a double data rate (DDR) SDRAM, in order to optimize a setup margin (a time interval between a time point at which a data transition occurs and a time point at which a read operation occurs) and a hold margin (a time interval between a time point at which a read operation occurs and a time point at which another data transition occurs) of data, the data strobe signal has to be shifted by 90°.

An external system clock signal or data strobe signal is applied to the DLL 110 and the DLL 110 measures and outputs a period of the applied system clock signal or data strobe signal. Outputs of the DLL 110 may be represented according to the number of delay chains included in the DLL 110.

The controller 120 receives the period of the system clock signal or data strobe signal from the DLL 110 and determines a delay length of the data strobe signal for optimizing the setup margin and the hold margin of the data. For example, the data strobe signal may be shifted by 90° in the DDR SDRAM. In this case, the DLL 110 counts the number of delay chains for a cycle of the data strobe signal, and the controller 120 multiplies the number of delay chains for the cycle by ¼ to calculate the number of delay chains required to shift the data strobe signal by 90°.

The delay line 130 delays the data strobe signal according to the delay length determined by the controller 120.

The flip-flop 140 latches and outputs external data by using the system clock signal or data strobe signal delayed and output from the delay line 130 as a trigger signal.

In this case, the general apparatus for controlling a data strobe signal cannot monitor the setup margin and the hold margin for the read operation of the data strobe signal. In addition, there is a problem in that there is no method of correcting the data strobe signal when conditions of the read operation are changed.

In addition, a margin in the read operation is smaller than that in a write operation due to input/output (I/O) power noise and jitter of the clock signal, so a method of optimizing the read margin is required.

In addition, a unit for checking the read margin between a chip including the SDRAM controller and the SDRAM is needed.

SUMMARY OF THE INVENTION

The present invention provides an apparatus for and method of controlling a data strobe signal capable of optimizing a setup margin and a hold margin of read data for the data strobe signal.

BRIEF DESCRIPTION OF THE DRAWINGS

The above and other features and advantages of the present invention will become more apparent by describing in detail exemplary embodiments thereof with reference to the attached drawings in which:

FIG. 6 is a flowchart of a method of controlling a data strobe signal according to another exemplary embodiment of the present invention.

DETAILED DESCRIPTION OF THE INVENTION

Hereinafter, exemplary embodiments of the present invention will be described in detail with reference to the attached drawings.

Figure 1:
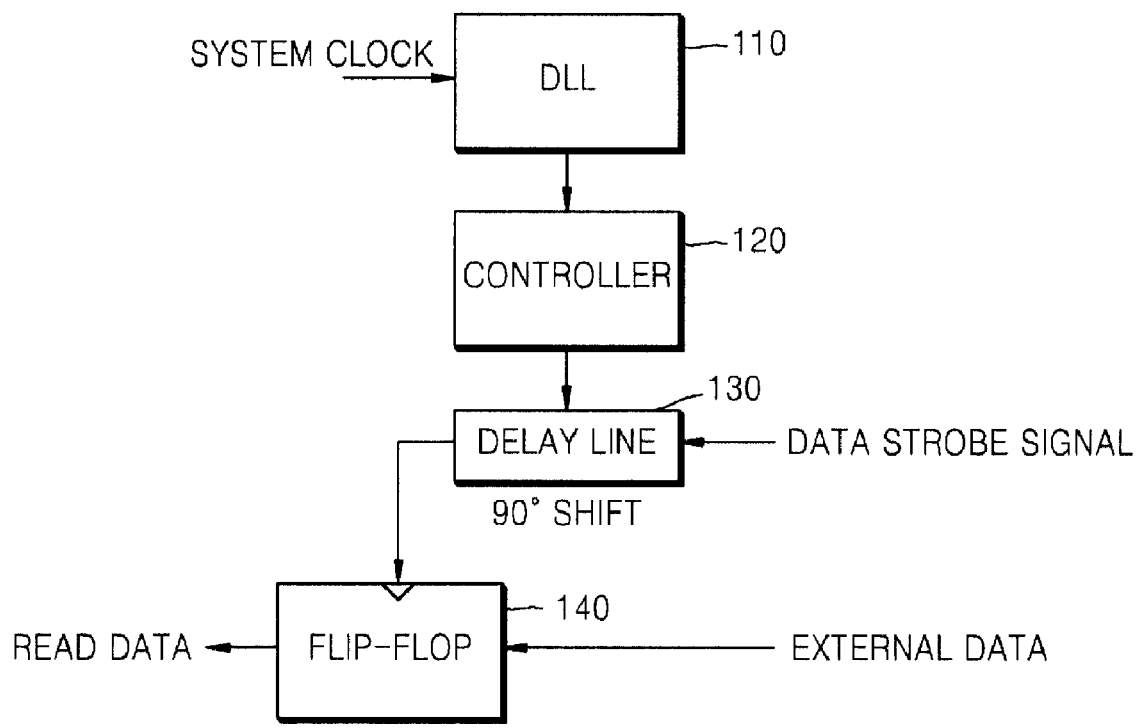
FIG. 1 is a view illustrating a general apparatus for controlling a data strobe signal to read external data.
Figure 2:
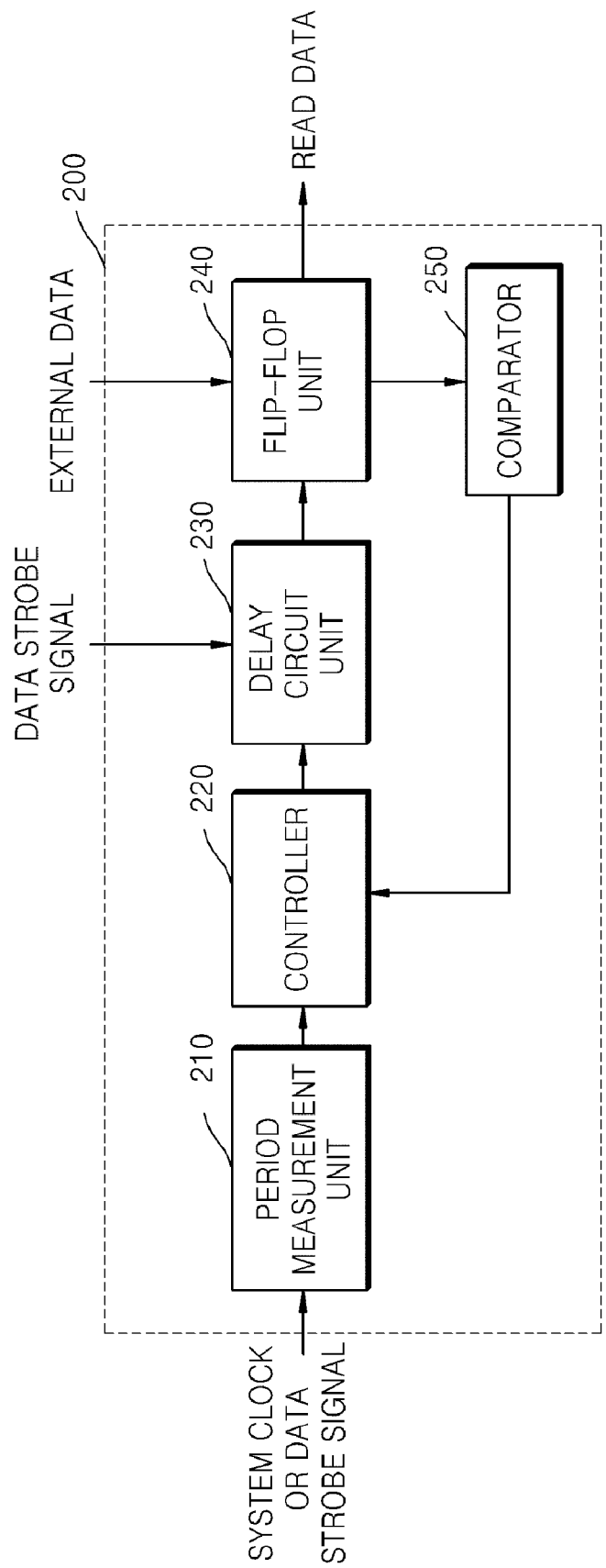
FIG. 2 is a view illustrating an apparatus for controlling a data strobe signal according to an exemplary embodiment of the present invention.

FIG. 2 is a view illustrating an apparatus for controlling a data strobe signal according to an embodiment of the present invention.

Referring to FIG. 2, the apparatus 200 for controlling a data strobe signal according to an embodiment of the present invention includes a period measurement unit 210, a controller 220, a delay circuit unit 230, a flip-flop unit 240, and a comparator 250.

The period measurement unit 210 receives an external system clock signal or data strobe signal and measures and outputs a period of the received system clock signal or data strobe signal.

The controller 220 receives the period of the system clock signal or data strobe signal from the period measurement unit 210 and determines a read delay time, a setup margin delay time, and a hold margin delay time of the data strobe signal for optimizing a setup margin and a hold margin of read data on the basis of the received period.

Here, the read delay time is a delay time used to allow the received data strobe signal (having the same phase as the read data) to be used for a read operation. In other words, the read delay time (for example, A+B in FIG. 4) is a delay time of the data strobe signal for optimizing the setup margin (for example, A+B in FIG. 4) and the hold margin (for example, C+D in FIG. 4) of data.

The received data strobe signal is delayed by the read delay time, and external data is latched by the data strobe signal delayed by the read delay time by the flip-flop unit 240 so as to be output. For example, the read delay time may be determined to be a value obtained by dividing the sum of the setup margin delay time and the hold margin delay time by 2.

The setup margin delay time is a value (for example, A in FIG. 4) used to determine the setup margin (for example, A+B in FIG. 4) that is a time interval between a time point at which a read data transition occurs and a time point at which a read operation occurs. The setup margin delay time may be set to an arbitrary value by a user when a system initially begins operation, and the external data is latched by the data strobe signal delayed by the setup margin delay time by the flip-flop unit 240 so as to be output. When the data latched by the data strobe signal delayed by the read delay time so as to be output and the data latched by the data strobe signal delayed by the setup margin delay time so as to be output are different from each other, it means that the setup margin delay time is not set to a proper value and has to be changed to a different value. A detailed description thereof is provided with reference to FIG. 2.

The hold margin delay time is a value (for example, A+B+C in FIG. 4) used to determine the hold margin (for example, C+D in FIG. 4) that is a time interval between a time point at which the read operation occurs and a time point at which another data transition occurs. The hold margin delay time may be set to an arbitrary value by the user when the system initially begins operation. The external data is latched by the data strobe signal delayed by the hold margin delay time by the flip-flop unit 240 so as to be output. When the data latched by the data strobe signal delayed by the read delay time so as to be output and the data latched by the data strobe signal delayed by the hold margin delay time so as to be output are different from each other, it means that the hold margin delay time has to be changed to a different value.

The delay circuit unit 230 receives the read delay time, the setup margin delay time, and the hold margin delay time from the controller 220 and receives an external data strobe signal. The delay circuit unit 230 outputs three signals generated by delaying the external data strobe signal by the read delay time, the setup margin delay time, and the hold margin delay time.

The flip-flop unit 240 receives the data strobe signals delayed by the read delay time, the setup margin delay time, and the hold margin delay time from the delay circuit unit 230 and externally (for example, from the SDRAM) receives data DQ. The external data DQ is latched by the data strobe signal delayed by the read delay time so as to be output. In addition, the data DQ is latched by the data strobe signals delayed by the read delay time, the setup margin delay time, and the hold margin delay time so as to be transmitted to the comparator 250.

The comparator 250 compares outputs from the flip-flop unit 240 with each other and feeds a result of the comparison back to the controller 220. For example, the comparator 250 may compare the data strobe signals delayed by the read delay time and the setup margin delay time with each other, or the data strobe signals delayed by the read delay time and the hold margin delay time with each other. The comparison is performed so that the controller 220 can monitor an accurate setup margin or hold margin. Specifically, the controller 220 adjusts the setup margin delay time or the hold margin delay time according to the result of the comparison of the comparator 250 to determine a proper read delay time.

In summary, when the clock signal has a changed duty cycle or frequency due to jitter components, when a fixed skew occurs in printed circuit board (PCB) routing, in package routing, or between an I/O of the chip, or when a skew between the data strobe signal and data, or between data and other data, occurs due to cross-talk, the setup margin or the hold margin for latching the external data may be changed. Therefore, the setup margin and the hold margin of the data can be optimized by the apparatus 200 for controlling the data strobe signal according to an embodiment of the present invention.

Figure 3:
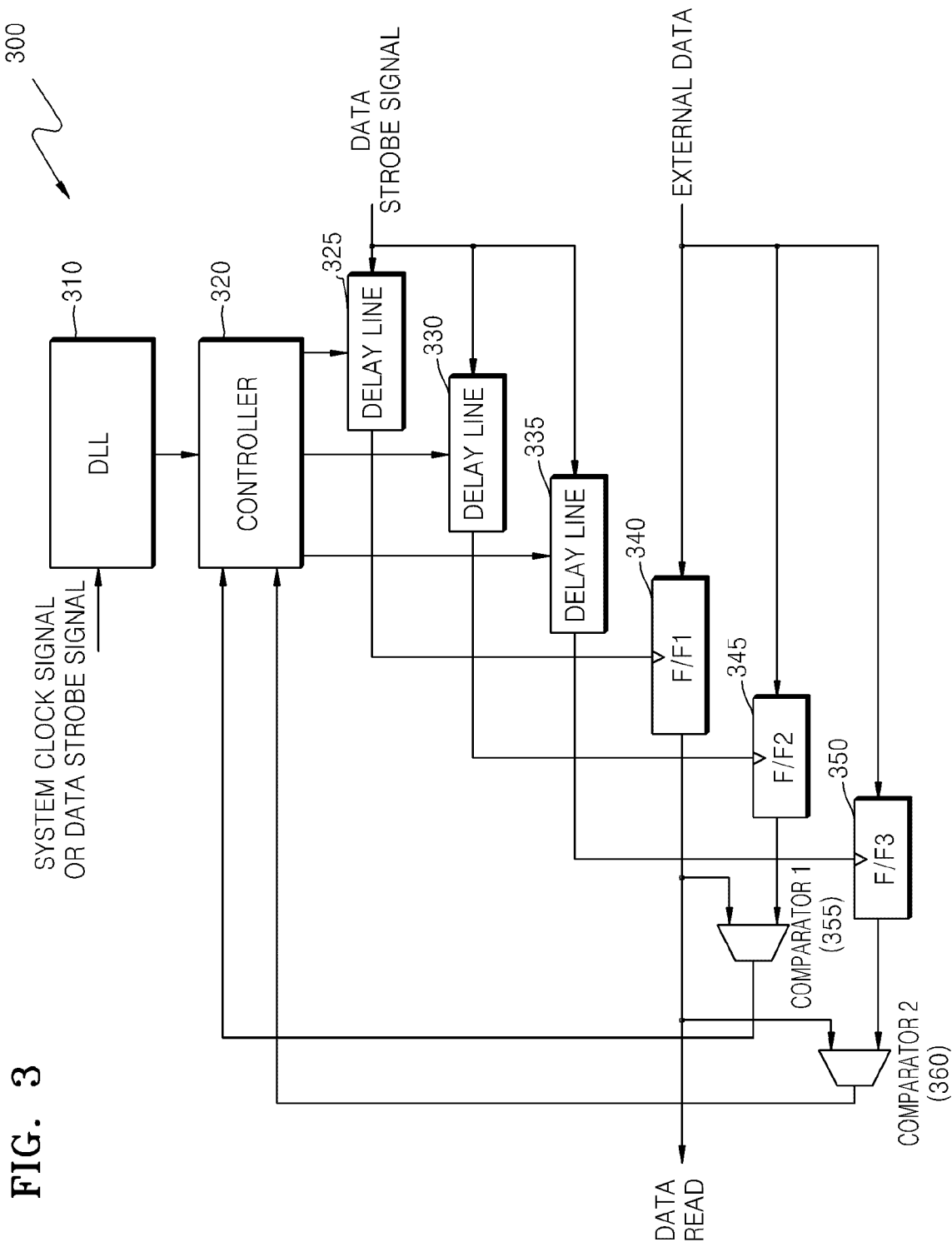
FIG. 3 is a view illustrating an apparatus for controlling a data strobe signal according to another exemplary embodiment of the present invention.

FIG. 3 is a view illustrating an apparatus for controlling a data strobe signal according to another embodiment of the present invention.

Referring to FIG. 3, the apparatus 300 for controlling a data strobe signal according to another embodiment of the present invention includes a delay locked loop (DLL) 310, a controller 320, delay lines 325, 330, and 335, flip-flops 340, 345, and 350, and comparators 355 and 360.

The DLL 310 receives an external system clock or data strobe signal and measures and outputs a period of the received system clock or data strobe signal. Outputs of the DLL 310 may be represented according to the number of delay chains included in the DLL 310.

The controller 320 receives the period of the system clock signal or data strobe signal from the DLL 310 and determines a read delay time, a setup margin delay time, and a hold margin delay time of the data strobe signal on the basis of the received period. The read delay time, the setup margin delay time, and the hold margin delay time are described above. The controller 320 may analyze feedback from the comparators 355 and 360 for a period of time set by the user in advance and update the read delay time according to a result of the analysis.

The controller 320 may determine the read delay time, the setup margin delay time, and the hold margin delay time to be values set by the user in advance when the system initially operates.

The delay lines 325, 330, and 335 include the first delay line 325 for outputting signals generated by delaying the data strobe signal by the read delay time, the second delay line 330 for outputting signals generated by delaying the data strobe signal by the setup margin delay time, and the third delay line 335 for outputting signals generated by delaying the data strobe signal by the hold margin delay time. Outputs of each of the delay lines 325, 330, and 335 are input to the flip-flops 340, 345, and 350 described later, and used as trigger signals.

The flip-flops 340, 345, and 350 include the first flip-flop 340 for latching and outputting external data by using the signal output from the first delay line 325, the second flip-flop 345 for latching and outputting input data by using the signal output from the second delay line 330, and the third flip-flop 350 for latching and outputting input data by using the signal output from the third delay line 335. The external data transmitted to the apparatus 300 for controlling a data strobe signal is latched by the first flip-flip 340 so as to be output as read data.

The comparators 355 and 360 include the first comparator 355 for comparing outputs from the first and second flip-flips 340 and 345 with each other and the second comparator 360 for comparing outputs from the first and third flip-flops 340 and 350 with each other. The comparators 355 and 360 compare data latched by the flip-flops 340, 345, and 350 with each other so as to allow the controller 320 to check whether or not a margin exists.

The controller 320 receives feedback signals from the first and second comparators 355 and 360. When the data output from the first and second flip-flops 340 and 345 are the same, the controller 320 determines that a setup margin exists as desired by the user, and when the output data are different from each other, the controller 320 determines that the setup margin does not exist. Therefore, for example, when the outputs from the first and second flip-flops 340 and 345 are different from each other, the controller 320 may increase the setup margin delay time by a predetermined time on the basis of the feedback from the first comparator 355. In another embodiment, when the data output from the first and second flip-flops 340 and 345 are the same, the controller 320 decreases the setup margin delay time by a predetermined time so as to acquire a result as close as possible to a practical setup margin.

Similarly, when the outputs from the first and third flip-flops 340 and 350 are different from each other by the feedback from the second comparator 360, the controller 320 decreases the hold margin delay time by a predetermined time. In addition, in another embodiment, when the data output from the first and third flip-flops 340 and 350 are the same, the controller 320 increases the hold margin delay time by a predetermined time so as to acquire a result as close as possible to a practical hold margin. Increments and decrements of the setup margin delay time and the hold margin delay time may be arbitrarily set by the user.

The controller 320, for example, determines and updates the read delay time to be a value obtained by dividing the sum of the setup margin delay time and the hold margin delay time by 2 when reading data from the DDR SDRAM. Specifically, the controller 320 performs control operations so that the external data is read at the center of a corrected setup boundary and hold boundary.

In addition, if the controller 320 controls the read delay time too frequently, the controller 320 may be affected by a momentary change in the external data or the data strobe signal, and therefore the controller 320 may be constructed to control the read delay time after monitoring changes for a predetermined time.

In addition, the controller 320 may not continuously determine the read delay time from power-on to power-off but determine the read delay time during a data read refresh interval. This is because a latch failure may occur if the delay line is updated while I/O operates.

Figure 4:
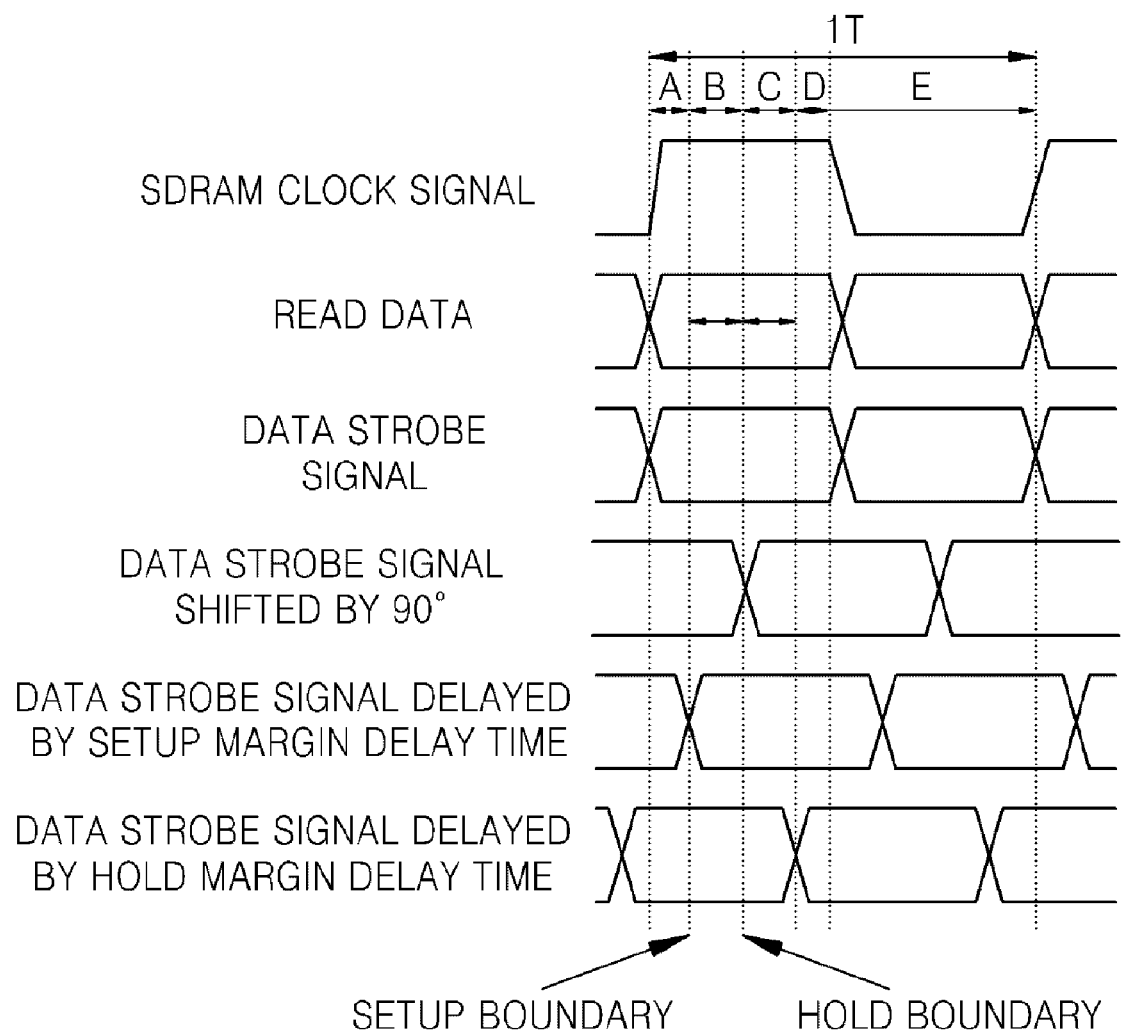
FIG. 4 is a timing diagram of signals in the apparatus for controlling a data strobe signal according to the embodiments illustrated in FIGS. 2 and 3.

FIG. 4 is a timing diagram of signals in the apparatus for controlling a data strobe signal according to the embodiments illustrated in FIGS. 2 and 3. This is described above with reference to FIGS. 2 and 3, so that an additional description is omitted.

Figure 5:
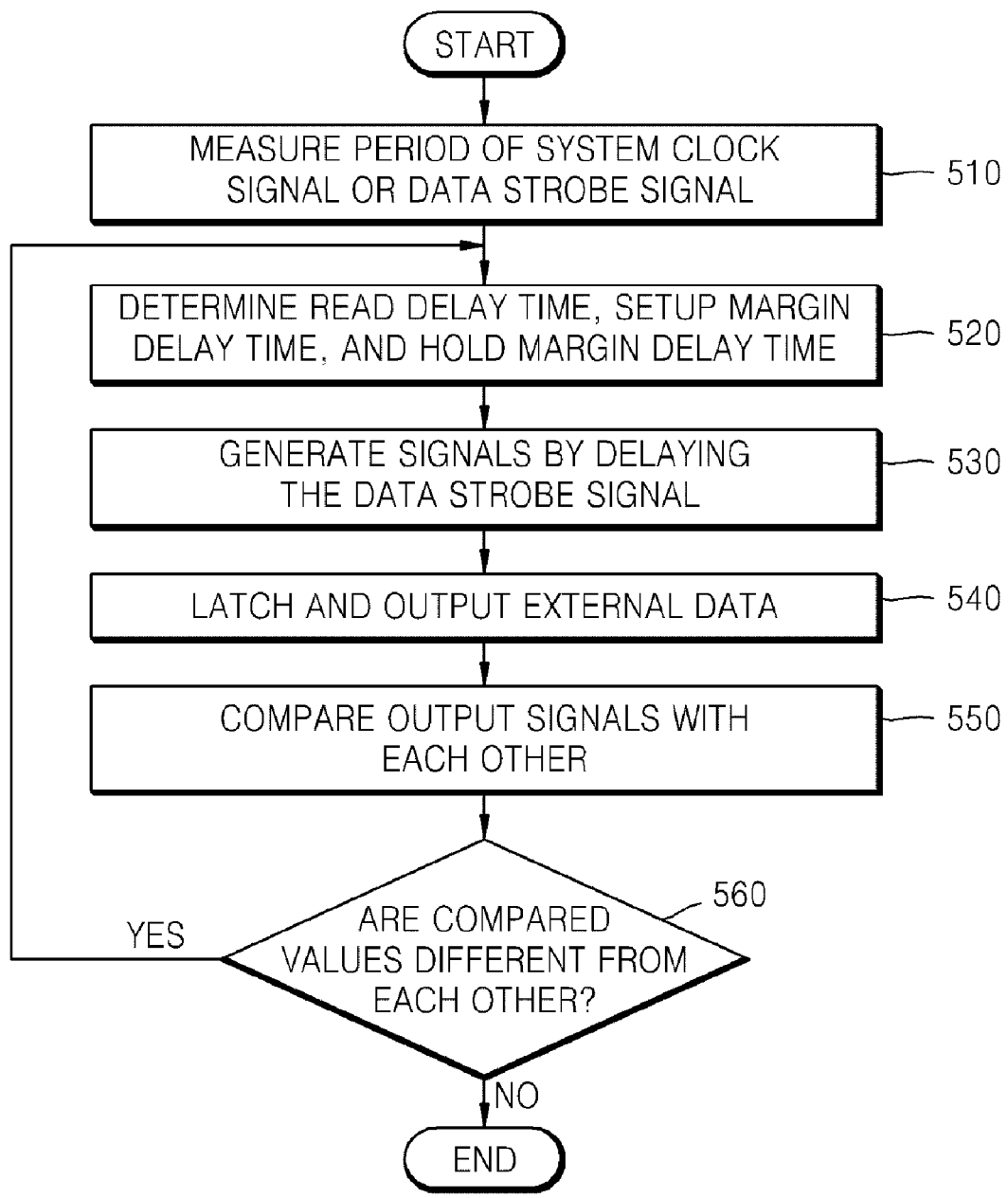
FIG. 5 is a flowchart of a method of controlling a data strobe signal according to an exemplary embodiment of the present invention.

FIG. 5 is a flowchart of a method of controlling a data strobe signal according to an embodiment of the present invention.

Referring to FIG. 5, in operation 510, a period of an input system clock signal or data strobe signal is measured. The period may be measured by the DLL.

In operation 520, a read delay time, a setup margin delay time, and a hold margin delay time of the system clock signal or data strobe signal are determined on the basis of the period measured in operation 5 10.

In operation 530, signals generated by delaying the data strobe signal by the read delay time, the setup margin delay time, and the hold margin delay time are generated. Operation 530 may be performed by the delay lines.

In operation 540, external data is latched by the signals generated in operation 530 so as to be output. Operation 540 may be performed by the flip-flops.

In operation 550, the signals output in operation 540 are compared with each other, and in operation 560, depending on a result of the comparison, operations 520 to 560 are repeated. Operations 550 and 560 may be performed by the comparator and the controller.

A detailed description thereof is provided above with reference to FIGS. 2 and 3, so that the detailed description is omitted.

FIG. 6 is a flowchart of a method of controlling a data strobe signal according to another embodiment of the present invention.

Referring to FIG. 6, operations 510 to 540 are performed before operation 610 in FIG. 6.

In operation 610, the data latched and output by a flip-flop by using the data strobe signal delayed by the read delay time (that is, the output from the first flip-flip F/F1) and the data latched and output by a flip-flop by using the data strobe signal delayed by the setup margin delay time (that is, the output from the second flip-flop F/F2) are compared with each other.

In operation 620, according to a result of the comparison, when the data are the same, operation 640 is performed, and when the data are different from each other, operation 630 is performed.

In operation 630, the setup margin delay time is increased. In another embodiment, after the setup margin delay time is increased in operation 630, operation 520 may be performed.

In operation 640, the data latched and output by a flip-flop by using the data strobe signal delayed by the read delay time (that is, the output from the first flip-flop F/F1) and the data latched and output by a flip-flop by using the data strobe signal delayed by the hold margin delay time (that is, the output from the third flip-flop F/F3) are compared with each other.

In operation 650, according to a result of the comparison, when the data are the same, operation 670 is performed, and when the data are different from each other, operation 660 is performed.

In operation 660, the hold margin delay time is decreased. In another embodiment, after the hold margin delay time is decreased in operation 660, operation 520 may be performed.

In operation 670, for example, in the DDR SDRAM, the read delay time shifted by 90° is determined to be a value obtained by dividing the sum of the setup margin delay time and the hold margin delay time by 2.

In another embodiment, determining the read delay time in operation 670 is not continuously performed from power-on to power-off, but performed only in the data read refresh interval. This is because latch failure may occur when the delay line is updated while I/O operates.

In another embodiment, in operation 620, according to the result of the comparison, when the data are the same, the setup margin delay time may be decreased. Similarly, in operation 650, when the data are the same according to the result of the comparison, the hold margin delay time may be increased.

Accordingly, the setup margin and the hold margin may be increased as much as possible.

Accordingly, in the apparatus for and method of controlling a data strobe signal, when an unexpected change in the read data or the data strobe signal occurs when the memory controller reads the data, the setup margin and the hold margin of the read data for the data strobe signal are optimized, so that it is possible to stably read the data recorded in a memory.

The invention can also be embodied as computer readable codes on a computer readable recording medium or on a computer readable transmission medium. The computer readable recording medium is any data storage device that can store data which can be thereafter be read by a computer system. Examples of the computer readable recording medium include read-only memory (ROM), random-access memory (RAM), CD-ROMs, magnetic tapes, floppy disks, and optical data storage devices. An example of a computer readable transmission medium is carrier waves (such as data transmission through the Internet). The computer readable recording medium can also be distributed over network coupled computer systems so that the computer readable code is stored and executed in a distributed fashion.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. An apparatus for controlling a data strobe signal comprising:
   a period measurement unit which measures a period of an input clock signal or data strobe signal;
   a controller which determines a read delay time, a setup margin delay time, and a hold margin delay time of the data strobe signal on the basis of the period;
   a delay circuit unit which outputs signals generated by delaying the data strobe signal by the read delay time, the setup margin delay time, and the hold margin delay time;
   a flip-flop unit which latches and outputs input data by using the signals output from the delay circuit unit; and
   a comparator which compares outputs from the flip-flop unit and feeds a result of the comparison back to the controller.

2. The apparatus of claim 1, wherein the period measurement unit is a delay locked loop.

3. The apparatus of claim 2, wherein the delay circuit unit comprises:
   a first delay line which outputs signals generated by delaying the data strobe signal by the read delay time;
   a second delay line which outputs signals generated by delaying the data strobe signal by the setup margin delay time; and
   a third delay line which outputs signals generated by delaying the data strobe signal by the hold margin delay time.

4. The apparatus of claim 3, wherein the flip-flop unit comprises:
   a first flip-flop which latches and outputs the input data by using the signal output from the first delay line;
   a second flip-flop which latches and outputs the input data by using the signal output from the second delay line; and
   a third flip-flop which latches and outputs the input data by using the signal output from the third delay line.

5. The apparatus of claim 4, wherein the comparator comprises:
   a first comparator which compares outputs from the first and second flip-flops with each other; and
   a second comparator which compares outputs from the first and third flip-flops with each other.

6. The apparatus of claim 5, wherein, when the outputs from the first and second flip-flops are different from each other, by feedback from the first comparator, the controller increases the setup margin delay time by a predetermined time.

7. The apparatus of claim 6, wherein the controller updates the read delay time as a value obtained by dividing the sum of the setup margin delay time and the hold margin delay time by 2.

8. The apparatus of claim 5, wherein, when the outputs from the first and third flip-flops are different, on the basis of the feedback from the second comparator, the controller decreases the hold margin delay time.

9. The apparatus of claim 8, wherein the controller updates the read delay time as a value obtained by dividing the sum of the setup margin delay time and the hold margin delay time by 2.

10. The apparatus of claim 1, wherein the controller determines the read delay time, the setup margin delay time, and the hold margin delay time to be values preset by a user when the apparatus initially begins operation.

11. The apparatus of claim 1, wherein the controller analyzes feedback from the comparator for a period of time preset by a user and selectively updates the read delay time according to a result of the analysis.

12. A method of controlling a data strobe signal comprising:
   (a) measuring a period of an input clock signal or data strobe signal;
   (b) determining a read delay time, a setup margin delay time, and a hold margin delay time of the data strobe signal on the basis of the period;
   (c) generating signals by delaying the data strobe signal by the read delay time, the setup margin delay time, and the hold margin delay time;
   (d) latching and outputting input data by using the signals generated in (c); and
   (e) comparing the signals output in (d) and selectively repeating (b) to (e) according to a result of the comparison.

13. The method of claim 12, wherein (a) is performed by a delayed locked loop.

14. The method of claim 13, wherein (c) is performed by one or more delay lines.

15. The method of claim 14, wherein (d) is performed by one or more flip-flops.

16. The method of claim 15, wherein (e) is performed by one or more comparators.

17. The method of claim 16, wherein in (b), the setup margin delay time is selectively increased by a predetermined time on the basis of feedback from the comparator.

18. The method of claim 16, wherein in (b), the hold margin delay time is selectively decreased by a predetermined time on the basis of feedback from the comparator.

19. The method of claim 12, wherein in (b), the result of the comparison in (e) is analyzed for a period of time preset by a user, and the read delay time is selectively updated according to a result of analysis.

20. A computer-readable medium having embodied thereon a computer program for performing a method, wherein the method comprises:
   (a) measuring a period of an input clock signal or data strobe signal;

(b) determining a read delay time, a setup margin delay time, and a hold margin delay time of the data strobe signal on the basis of the period;

(c) generating signals by delaying the data strobe signal by the read delay time, the setup margin delay time, and the hold margin delay time;

(d) latching and outputting input data by using the signals generated in (c); and (e) comparing the signals output in (d) and selectively repeating (b) to (e) according to a result of the comparison.

* * * * *